(12) United States Patent
Kim

(10) Patent No.: US 7,426,229 B2
(45) Date of Patent: Sep. 16, 2008

(54) LINE NARROWING MODULE, LIGHT SOURCE OF EXPOSURE APPARATUS COMPRISING THE SAME, AND METHOD OF PRODUCING EXPOSURE LIGHT USING LINE NARROWING

(75) Inventor: Jang-Sun Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 109 days.

(21) Appl. No.: 11/445,314

(22) Filed: Jun. 2, 2006

(65) Prior Publication Data

US 2007/0036183 A1  Feb. 15, 2007

(30) Foreign Application Priority Data

Aug. 5, 2005  (KR) .................. 10-2005-0071917

(51) Int. Cl.
*H01S 3/08* (2006.01)
(52) U.S. Cl. ..................... 372/108; 372/9; 372/55; 372/57; 372/98; 372/99; 372/100; 372/102
(58) Field of Classification Search ............... 372/9, 372/55, 57, 98, 99, 100, 102, 108
See application file for complete search history.

(56) References Cited

U.S. PATENT DOCUMENTS 5,917,849 A  6/1999  Ershov
6,101,211 A *  8/2000  Wakabayashi et al. ...... 372/102
6,621,846 B1 *  9/2003  Sandstrom et al. ............ 372/57
6,717,973 B2 *  4/2004  Basting et al. ................. 372/52
6,721,340 B1 *  4/2004  Fomenkov et al. ............ 372/25
6,735,232 B2  5/2004  Schroeder et al.

FOREIGN PATENT DOCUMENTS

KR  10-1998-703204  10/1998

\* cited by examiner

*Primary Examiner*—Minsun Harvey
*Assistant Examiner*—Kinam Park
(74) *Attorney, Agent, or Firm*—Volentine & Whitt, PLLC

(57) ABSTRACT

A line narrowing module includes an elliptical mirror, a diffraction grating disposed at a first focus of the mirror for separating an incident beam into different lines, and a laser beam dispersion and extraction unit. The laser beam dispersion and extraction unit disperses incident laser over the diffraction grating and selectively extract from the resulting lines a laser beam having a desired narrowed bandwidth. A light source that employs the line narrowing module also includes a laser oscillator for generating the beam, and a light returning unit that returns one fraction of the beam extracted from the laser oscillator back to the laser oscillator. Another fraction of the beam is extracted from the laser oscillator through a front window of the laser oscillator, and undergoes line narrowing in the module. The laser beam having the narrowed bandwidth is immediately output as the exposure light from the module.

33 Claims, 5 Drawing Sheets

LINE NARROWING MODULE, LIGHT SOURCE OF EXPOSURE APPARATUS COMPRISING THE SAME, AND METHOD OF PRODUCING EXPOSURE LIGHT USING LINE NARROWING

BACKGROUND OF THE INVENTION

1. Field of the Invention

The present invention relates to an exposure apparatus of photolithography equipment used in the manufacturing of semiconductor devices and the like. More particularly, the present invention relates to a light source of the exposure apparatus having a line narrowing module.

2. Description of Related Art

Photolithography equipment is used to form patterns, e.g. circuit patterns, on a substrate in the manufacturing of semiconductor devices and the like. An exposure apparatus of the photolithography equipment generally includes a reticle that defines a pattern to be transferred to a resist on the substrate, a light source for illuminating the reticle with an exposure light such that an image of the reticle pattern is picked up by the exposure light, and a projection lens for focusing the exposure light onto the resist on the substrate. Today's semiconductor devices are being made with increasingly higher integration densities to meet the demand for slimmer and more compact electronic devices. This requires that the exposure apparatus of the photolithography equipment have a light source that emits light having a small wavelength and provides a great depth of focus. Light sources typically employed by exposure apparatus include ultra-high pressure mercury lamps, KrF excimer lasers, ArF excimer lasers, and recently, $F_2$ lasers which are still undergoing testing. An ultra-high pressure mercury lamp emits exposure light having a wavelength of the g-line or i-line of the mercury emission spectrum. A KrF excimer laser emits exposure light having a wavelength (about 248 nm) shorter than that emitted by the mercury lamp. An ArF excimer laser emits exposure light having a wavelength of about 193 nm, and an $F_2$ laser emits exposure light having a wavelength of about 157 nm.

However, the projection lens of a typical exposure apparatus has a different refractive index for different wavelengths of light, and an oscillating laser such as a KrF excimer laser or an ArF laser emits deep ultraviolet light having a relatively large bandwidth. Accordingly, chromatic aberration would occur in an image produced by exposure apparatus which employ a KrF excimer laser or an ArF laser. The chromatic aberration is difficult to correct using additional optics. For this reason, excimer lasers emit monochromatic laser light and the light source also performs what is known as line narrowing to increase the monochromatic characteristic of the exposure light (narrow the bandwidth) and thereby prevent chromatic aberration from occurring in the image. That is, line narrowing allows an oscillating laser, such as a KrF excimer laser or an ArF laser, to be used in an exposure apparatus of photolithographic equipment for manufacturing highly integrated semiconductor devices.

FIG. 1 is a schematic diagram of a conventional laser light source of an exposure apparatus. The light source 10 generally includes a laser oscillator 20, a line narrowing module 30, and an output coupler 40.

The laser oscillator 20 excites a gas mixture, typically including a noble gas such as Ar, Kr, and Ne, and a halogen including fluorine (F), using a laser beam or an electric discharge. The excited F atoms are coupled with gas atoms (e.g., Kr or Ar atoms) in the ground state to create a molecule referred to as an excimer (excited dimer). The excimer exists only in an excited state (not in the ground state), and is unstable. The excimer thus decays within nanoseconds of its formation, thereby discharging ultraviolet light via natural emission and returning to the ground state whereupon its components dissociate. In addition to naturally decaying, excimers are also stimulated to decay in the laser oscillator 20 by UV light that is returned to the laser oscillator 20 by the output coupler 40. In this way, the emission of the UV light is amplified and a portion of the UV light so generated is output as a laser beam. In FIG. 1, reference numeral 21 indicates the region in which excitation occurs in the laser oscillator 20.

Whereas one fraction of the laser beam is output from the laser oscillator 20 to the output coupler 40, another fraction of the laser beam is output from the laser oscillator 20 to the line narrowing module 30 through a rear window 24 of the laser oscillator 20. Inside the module 30, the laser beam passes through a slit 31, is dispersed by a prism beam expander 32, and then is reflected by a total reflection mirror 34 onto a diffraction grating 36. The laser beam is diffracted by the diffraction grating 36 to thereby separate the light which entered the module 30 into different bands or lines. One line, i.e., light having a reduced bandwidth, is returned to the laser oscillator 20. On the other hand, other lines of the laser beam are scattered by a black body in the line narrowing module 30 so as to not return to the laser oscillator 20. Thus, optical energy is wasted.

Meanwhile, the beam input to the laser oscillator 20 is, in turn, input to the output coupler 40 through a front window 23 of the laser oscillator 20. However, only about 20% of that beam is output from the light source due to the provision of a partial reflection mirror 42 of the optical coupler 40. The other 80% is reflected back into the laser oscillator 20 by the partial reflection mirror 42, and stimulates the emission of the UV light in the laser excitation region 21 of the laser oscillator 20. The resulting laser beam is input to the line narrowing module 30 through the rear window 24 of the laser oscillator 20 whereby the above-described processes are repeated.

The depth of focus in a typical process of exposing a layer of resist on a substrate varies by about 0.225 μm per 1 pm of variation in the bandwidth of the exposure light. Thus, the exposure light must have a precise bandwidth if the layer of resist is to be exposed properly enough so that a fine pattern can be formed on the substrate. Preferably, a KrF laser of an exposure apparatus should output exposure light having a wavelength of 248.4 nm and a bandwidth of 0.6 pm when used in a process of fabricating a fine pattern on a substrate. However, in the case of the conventional light source shown in FIG. 1, although the laser beam that is returned to the laser oscillator 20 from the line narrowing module 30 has a reduced bandwidth, e.g., a bandwidth of 0.6 pm, the laser beam comingles with the laser beam created in the laser excitation region 21 of the laser oscillator 20. Therefore, the precision of the reduced bandwidth is considerably degraded. That is, a laser beam having a precise desired bandwidth is not output by the light source.

SUMMARY OF THE INVENTION

An object of the present invention is to provide a light source of an exposure apparatus that is highly optically energy efficient at producing exposure light having a narrow bandwidth.

Similarly, another object of the present invention is to provide a highly optically energy efficient method of producing exposure light having a narrow bandwidth.

Another object of the present invention is to provide a light source of an exposure apparatus that will consistently output with precision a laser beam having a wavelength within a desired narrow band.

Likewise, another object of the present invention is to provide a method of consistently outputting a laser beam having a wavelength within a desired narrow band.

According to one aspect of the present invention, a light source of an exposure apparatus includes a laser oscillator that generates a laser beam, a light returning unit, and a line narrowing module that directly outputs the exposure light. Basically, the line narrowing module effectively narrows the bandwidth of the laser beam generated by the oscillator and outputs a beam having a wavelength confined to a predetermined narrow band of the spectrum (hereinafter referred to merely as a laser beam having the desired bandwidth). More specifically, the line narrowing module is disposed to receive the laser beam extracted through a front window of the laser oscillator and is optically configured to selectively extract therefrom a laser beam having a desired bandwidth, i.e., a bandwidth narrower than that of the laser beam generated by the laser oscillator. The line narrowing module is also optically configured to direct the laser beam having the desired bandwidth along a second optical path that does not pass into the laser oscillator, and to return to the laser oscillator most of the light constituted by lines of the laser beam other than the extracted band. The laser beam return unit receives a fraction of the laser beam generated in the laser oscillator and extracted through the rear window of the laser oscillator and returns the same to the laser oscillator.

According to another aspect of the present invention, the line narrowing module includes a diffraction grating, a laser beam dispersion and extraction unit, and an elliptical mirror. The diffraction grating is disposed at a first focus of the elliptical mirror to separate a laser beam incident thereon, namely, the laser beam extracted from the front window of the laser oscillator, into different lines. The laser beam dispersion and extraction unit is situated in the module between the foci of the elliptical mirror, and is optically configured to disperse a laser beam, incident thereon from a region containing the second focus of the elliptical mirror, over the diffraction grating. The unit is also optically configured to selectively extract from the diffracted light the laser beam having the desired bandwidth. Most of the remainder of the diffracted light, because it emanates from the grating at the first focus of the elliptical mirror, is reflected by the elliptical mirror to the region having the second focus. Preferably, the elliptical mirror has an opening adjacent the second focus, and the front window of the laser oscillator is located at the second focus.

Also, the elliptical mirror may have an output window at a location situated relative to the laser beam dispersion and extraction unit such that laser beam extracted by the laser beam dispersion and extraction unit is incident on the output window. The laser beam dispersion and extraction unit may be a prism having a selective reflective coating on one side, in which case the prism is oriented so that the coating reflects the laser beam having the predetermined bandwidth through the output window. Also, the output window may include a transparent body, and a selective transmission coating covering a surface of the body for transmitting the laser beam having the predetermined bandwidth and reflecting other lines of the laser beam.

The line narrowing module may further include a diffraction grating cooling unit for cooling the diffraction grating. Preferably, the cooling unit includes a gas supply and a nozzle for ejecting a cooling gas toward a rear surface of the diffraction grating. The cooling gas may be nitrogen or helium. Also, a cooling gas anti-diffusion shield may be provided around the diffraction grating between the front and rear surfaces thereof for preventing the cooling gas from diffusing toward the front surface of the diffraction grating.

In accordance with another aspect of the present invention, there is provided a method of producing exposure light for use in a process of exposing a resist, the method comprising generating a laser beam in a laser oscillator, extracting one fraction of the laser beam from the laser oscillator through a front window of the laser oscillator, line narrowing the one fraction of the laser beam to thereby produce a laser beam having a desired narrow bandwidth, returning most of the other light produced as a result of the line narrowing to the laser oscillator, outputting the laser beam having the desired bandwidth as the exposure light without ever first returning it to the laser oscillator, and extracting another fraction of the laser beam from the laser oscillator through a rear window of the laser oscillator and returning substantially all of that fraction of the laser beam to the laser oscillator.

BRIEF DESCRIPTION OF THE DRAWINGS

The foregoing and other objects, features and advantages of the present invention will be more apparent from the detailed description of the preferred embodiments thereof, as illustrated in the accompanying drawings, in which.

DETAILED DESCRIPTION OF THE PREFERRED EMBODIMENTS

Figure 1:
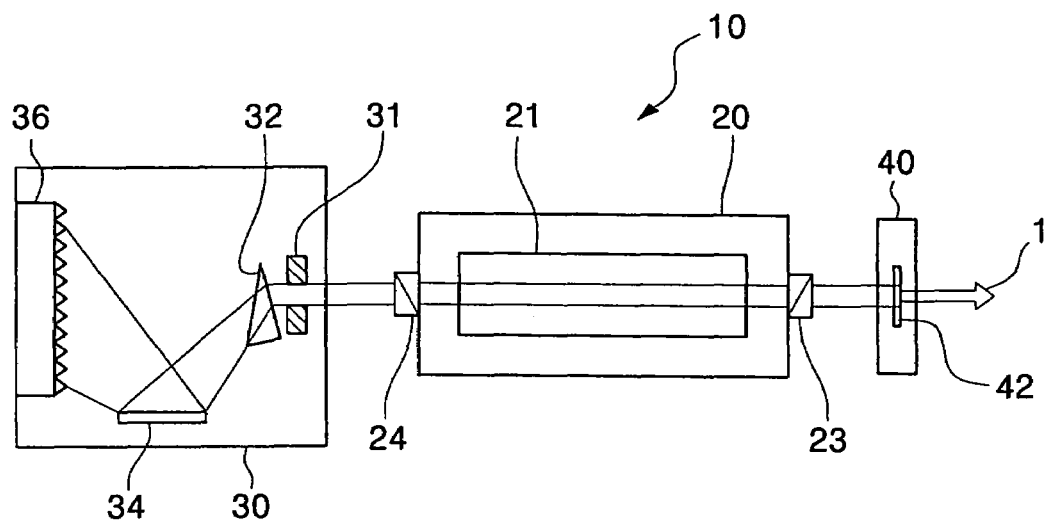
FIG. 1 is a schematic diagram of a conventional laser light source of exposure apparatus.

The present invention will now be described more fully hereinafter with reference to the accompanying drawings. Like reference numerals designate like elements throughout the drawings.

Figure 2:
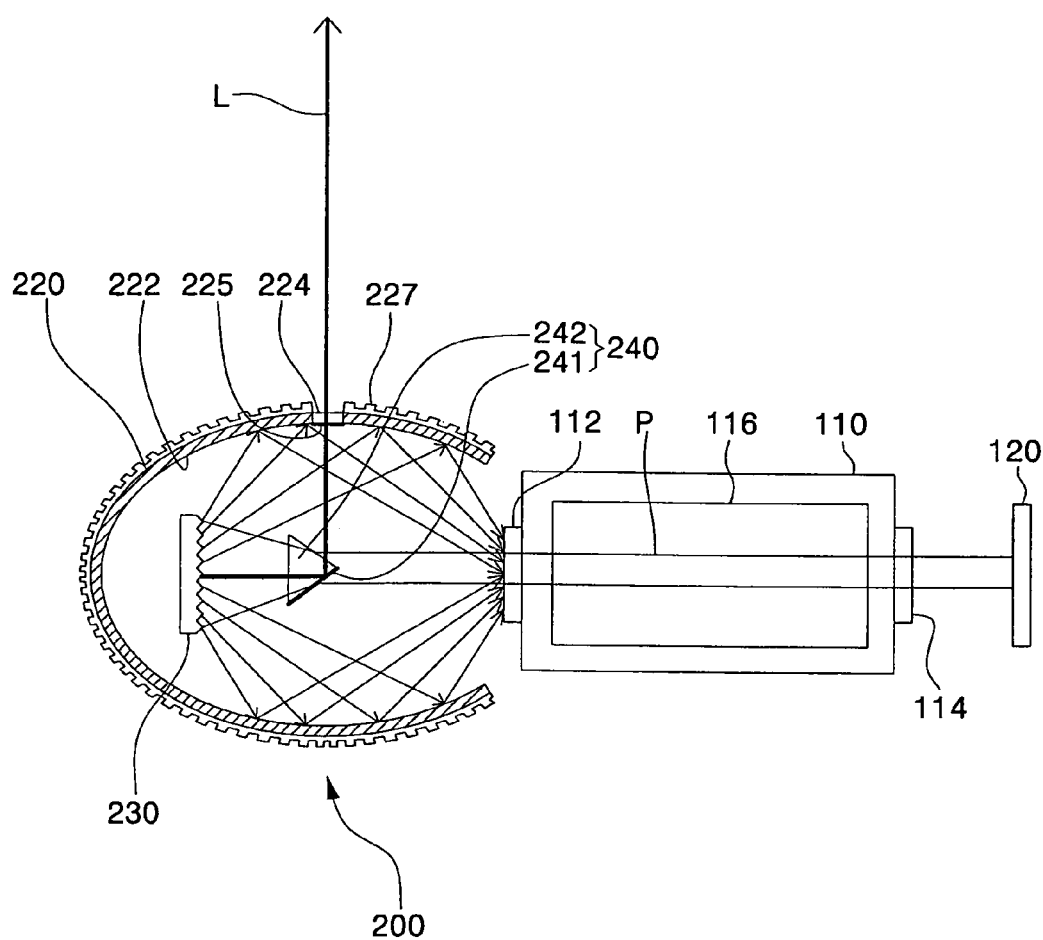
FIG. 2 is a schematic diagram of an embodiment of a laser light source of exposure apparatus in accordance with the present invention.

First, referring to FIG. 2, a light source of an exposure apparatus in accordance with the present invention generally includes a laser oscillator 110 for generating a laser beam, a line narrowing module 200 for reducing the bandwidth of a fraction of the laser beam introduced into the module through a front window 112 of the laser oscillator 110, and a laser beam returning unit 120 for returning to the laser oscillator 110 a fraction of the laser beam emitted through a rear window 114 of the laser oscillator 110.

The laser oscillator 110 excites laser gas, for example, a mixture of gases including a noble gas such as Kr, Ar or Ne, and a halogen including fluorine (F), using a laser beam or an electric discharge. For example, the laser oscillator 110 is filled with a gas mixture including Kr and F atoms. In this case, the excited F atoms are coupled with Kr atoms in the ground state to create KrF molecules existing only in an excited state, i.e., so-called "excimers". The excimers are unstable and instantly decay into the ground state, thereby emitting ultraviolet light by what is called "natural emission".

The ultraviolet light is coherent and a fraction of the resulting laser beam is extracted through the front window 112 of the laser oscillator 110 and passes into the line narrowing module 200. Another fraction of the laser beam is extracted through the rear window 114 of the laser oscillator 110 and is incident on the laser beam returning unit 120. In FIG. 2, reference numeral 116 denotes the region in the laser oscillator in which the excitation of the gas takes place, and reference character P denotes an optical path of the resulting laser beam.

The line narrowing module 200 separates the laser beam into different bands or lines, selectively outputs a laser beam L of one line and having a predetermined bandwidth, and returns most of the light constituted by the other lines of the laser beam to the laser oscillator 110. In a process in which the KrF excimer laser beam is produced, the KrF beam has a wavelength of about 248.4 nm, and more specifically, of about 248.3271 nm, and the predetermined bandwidth of the KrF laser beam output from the line narrowing module 200 is about 0.6 pm.

To this end, the line narrowing module 200 includes a diffraction grating 230, a laser beam dispersion and extraction unit 240, and an elliptical mirror 220. The diffraction grating 230 separates the laser beam generated in the laser oscillator 110 into different lines. The laser beam dispersion and extraction unit 240 expands the laser beam that enters the module 230 through the front window 112 of the laser oscillator 110, directs the expanded laser beam onto the diffraction grating 230, and extracts as a laser beam L a predetermined band of the laser beam diffracted by the diffraction grating 230. The elliptical mirror 220 returns the lines other than the band constituting the laser beam L to the laser oscillator 110 through the front window 112. The elliptical mirror 220 may have an output window 224 at one side thereof through which the laser beam L is transmitted.

The laser beam dispersion and extraction unit 240 may include a prism 242 as a beam expander, and a selective reflective coating 241 as a beam extractor. The selective reflective coating 241 covers one side of the prism 242. The selective reflective coating 241 may comprise dielectric layers having two different refractive indices alternately disposed one atop the other on the prism 242, and each of which layers has a thickness smaller or larger than $\lambda/4n$ so that the coating 241 selectively reflects only the laser beam L, i.e., the laser light having a wavelength within a predetermined band of the ultraviolet spectrum. In addition, a selective transmission coating 225 covers the output window 224 to selectively transmit only the laser beam L and reflect other lines of the laser light. The selective transmission coating 225 may also be formed of alternating dielectric layers having two different refractive indices.

The elliptical mirror 220 reflects the lines of light formed by the diffraction grating 230, except for the band constituting the laser beam L, back to the laser oscillator 110 through the front window 112 thereof. For this purpose, the elliptical mirror 220 is situated such that the front window 112 of the laser oscillator 110 is located at one focus of the elliptical mirror 220 and the diffraction grating 230 is located at the other focus of the elliptical mirror 220. Preferably, the elliptical mirror 220 comprises an elliptical body through which the window 224 extends, and a highly reflective coating 222 formed over the entire inner surface of the elliptical body but not over the output window 224. Furthermore, a heat sink 227 may be disposed along an outer surface of the elliptical mirror 220 to dissipate the heat created when the laser light is reflected by the elliptical mirror 220 back into the laser oscillator 110 through the front window 112. Therefore, the elliptical mirror 220 will not be damaged by the heat.

The laser beam returning unit 120 acts to return the fraction of the laser beam emitted through the rear window 114 of the laser oscillator 110 back to the laser oscillator 110, whereby the emission of light in the laser excitation region 116 is amplified.

Figure 3:
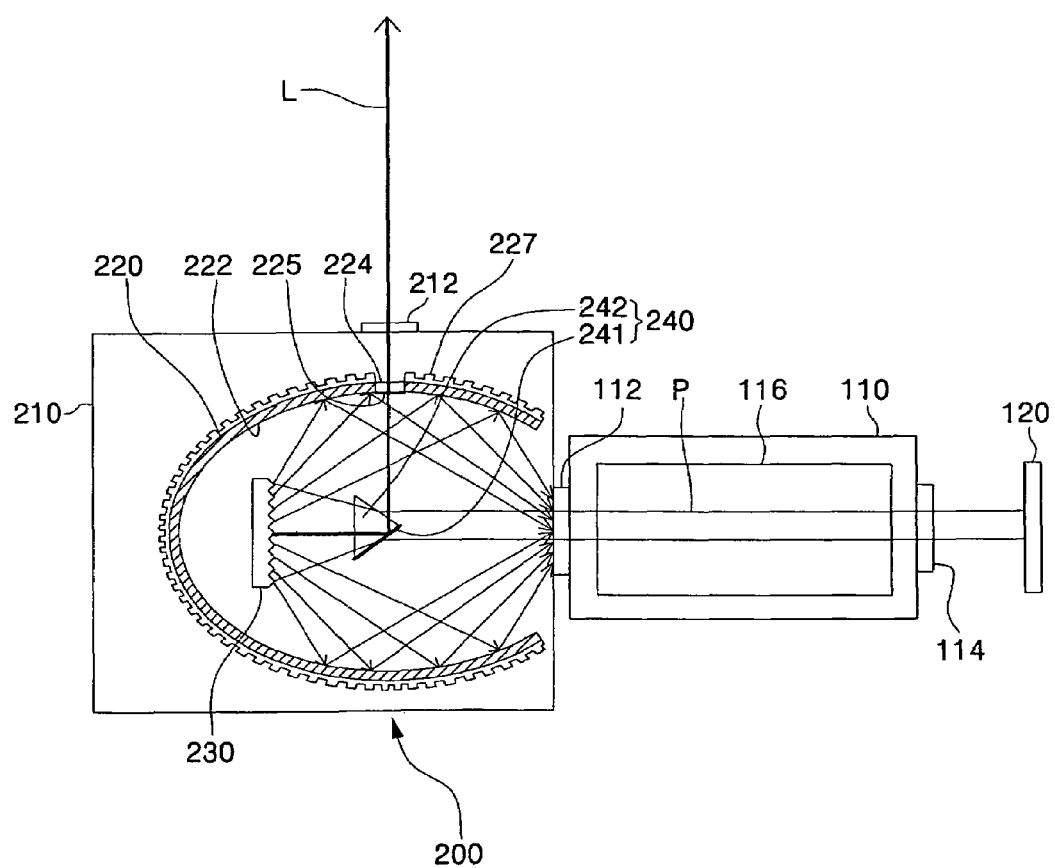
FIG. 3 is a schematic diagram of another embodiment of a laser light source of exposure apparatus in accordance with the present invention.

FIG. 3 illustrates a light source of an exposure apparatus in accordance with another embodiment of the present invention. Referring to FIG. 3, the line narrowing module 200 may include a chamber 210 for absorbing and naturally scattering a small fraction of the laser beam diffracted by the diffraction grating 230. Reference numeral 212 denotes a window for transmitting the laser beam L extracted by the laser beam dispersion and extraction unit 240 and directed through the output window 224 of the elliptical mirror 220.

Figure 4:
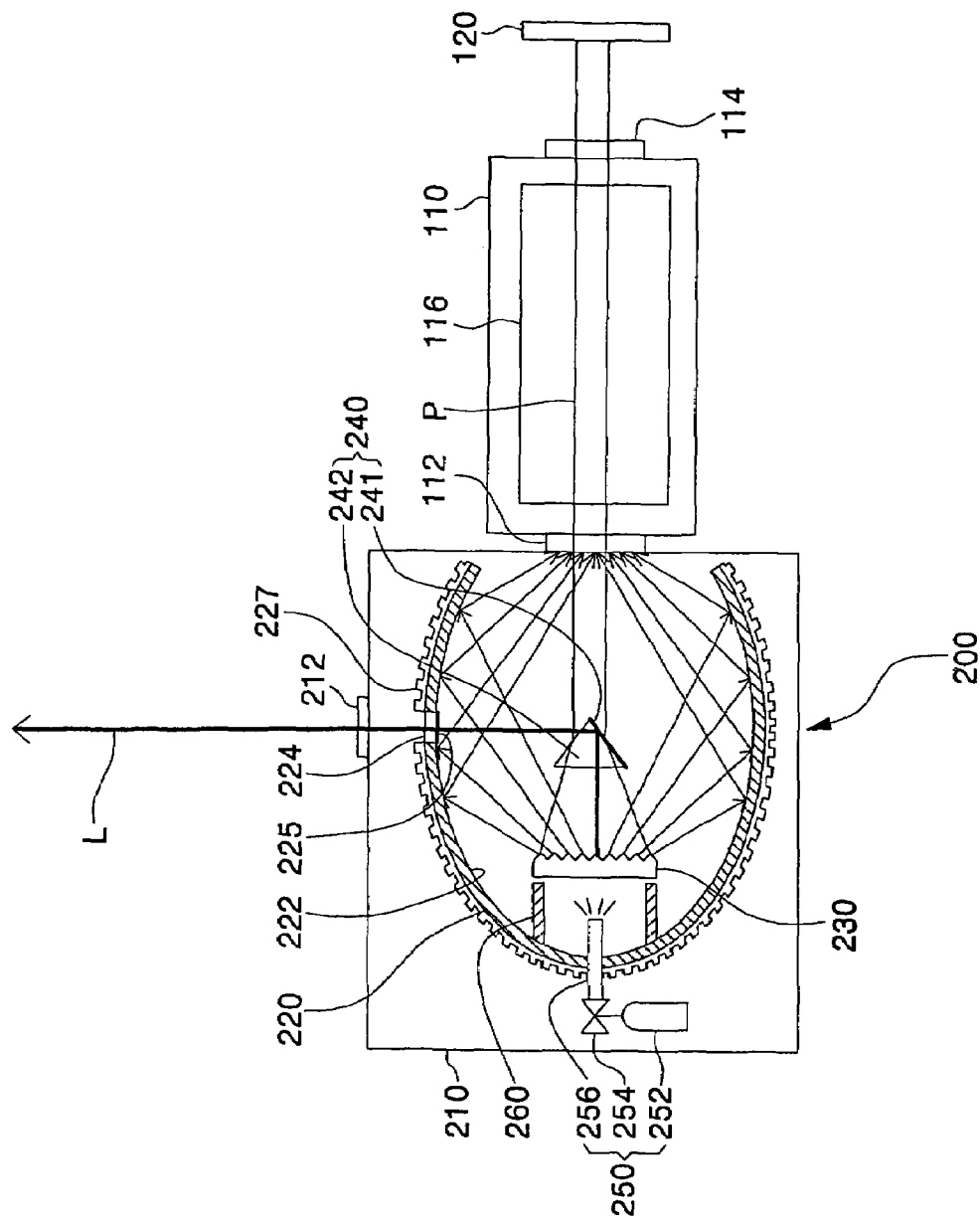
FIG. 4 is a schematic diagram of still another embodiment of a laser light source of exposure apparatus in accordance with the present invention.

FIG. 4 illustrates a light source of an exposure apparatus in accordance with still another embodiment of the present invention. Referring to FIG. 4, the line narrowing module 200 includes a diffraction grating cooling unit 250 for spraying a cooling gas onto a rear surface of the diffraction grating 230 to cool the diffraction grating 230. The diffraction grating cooling unit 250 includes a vessel containing cooling gas 252, a gas supply adjustment valve 254, and a nozzle 256 extending through the elliptical mirror 220. Cooling gas from the vessel 252 is ejected from the nozzle 256, at a rate set by the gas supply adjustment valve 254, onto a central part of the rear surface of the diffraction grating 230. The cooling gas may be nitrogen or helium, but is preferably helium because helium has a differential refractive index smaller than that of nitrogen and a thermal conductivity larger than that of nitrogen.

Generally, about 15 to 20% of the laser beam that is incident on the diffraction grating 230 is absorbed by the diffraction grating 230. Thus, the diffraction grating 230 is heated. Furthermore, the laser beam is concentrated at a central part of the diffraction grating 230 such that the temperature of the central part becomes higher than that of an outer peripheral part of the diffraction grating 230. Such an irregular temperature distribution across the diffraction grating 230 may cause the density of a layer of air in front of the grating to become irregular. In this case, the portions of the expanded laser beam propagating to/from the central and the outer peripheral parts of the diffraction grating 230 would undergo different phase changes. The diffraction grating cooling unit 250 ejects a cooling gas toward the rear central part of the diffraction grating 230 to thereby prevent the diffraction grating 230 from being damaged by heat. In addition, the diffraction grating cooling unit 250 makes the temperature distribution across the diffraction grating 230 uniform to prevent variations in the density of the layer of air in front of the diffraction grating 230. Hence, the diffraction grating cooling unit 250 prevents phase differences from occurring in the laser beam as the beam passes through the layer of air in front of the diffraction grating 230.

In addition, a cooling gas anti-diffusion shield 260 may be provided to prevent the cooling gas from diffusing to the front of the diffraction grating 230. The cooling gas anti-diffusion shield 260 may be installed on the elliptical mirror 220. The cooling gas anti-diffusion shield 260 functions to prevent the laser beam from being distorted by the cooling gas, which would otherwise happen if the cooling gas were allowed to flow onto the front surface of the diffraction grating 230.

Figure 5:
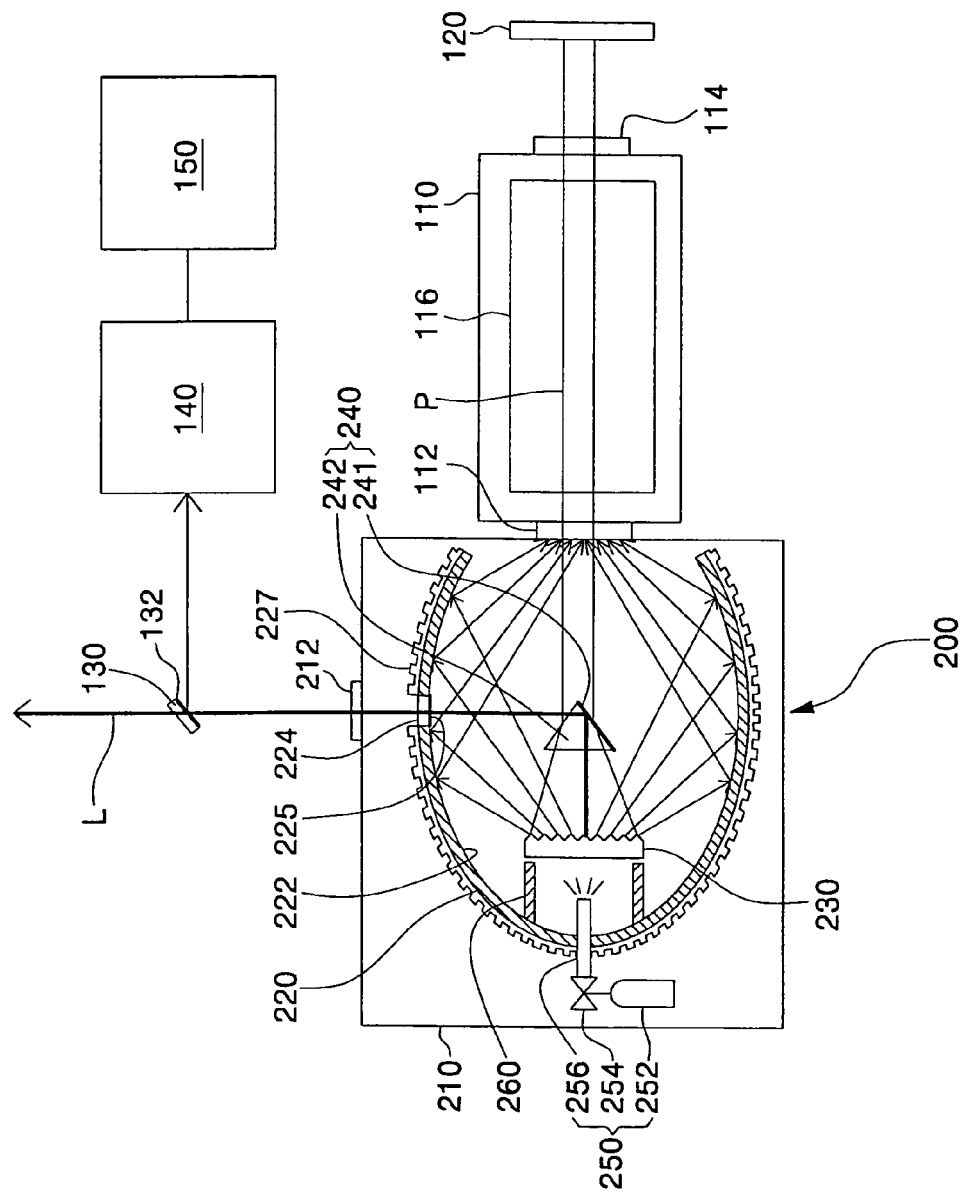
FIG. 5 is a schematic diagram of yet another embodiment of a laser light source of exposure apparatus in accordance with the present invention.

FIG. 5 illustrates still another embodiment of the present invention. Referring to FIG. 5, the light source may include an optical detection unit 140 for detecting the laser beam L output from the line narrowing module 200 and generating signals representative of the laser beam L, and an optical analysis unit 150 for determining the optical intensity, wavelength, spectral band and so on of the laser beam L on the basis of values of the signals generated by the optical detection unit 140. In this respect, the optical detection unit 140 may be a photo sensor array, and the optical analysis unit 150 may comprise a computer processor configured with a predetermined comparison and analysis program Reference numeral 130 denotes a partial reflective mirror comprising a partial reflective coating 132 for transmitting most of the laser beam L output from the line narrowing module 200 and reflecting only a small fraction thereof to the optical detection unit 140 so that the laser beam L can be analyzed in real time. Thus, it is possible to control the light source on the basis of the real time analysis to maintain the optical intensity, wavelength, and bandwidth of the laser beam L within desired ranges.

As described above, according to the present invention, a predetermined band or line of laser light is selectively extracted and output from the line narrowing module 200 as exposure light. The extracted line is thus not commingled with other lines of the laser beam in the laser oscillator 110 (compare with the prior art of FIG. 1). Accordingly, the exposure light may have a constant and precise bandwidth of, for example, about 0.6 pm. In addition, nearly all of the lines of the laser except that constituting the extracted laser beam L are returned to the laser oscillator 110 so that the energy thereof is reused. Thus, the light source of the present invention has a high degree of optical efficiency.

Finally, although the present invention has been described herein in connection with the preferred embodiments thereof, the present invention is not so limited. Rather, changes in the form and details of the preferred embodiments will be readily apparent to those of ordinary skill in the art. For example, the present invention has been described above in connection with the generation of a KrF laser beam using a gain medium comprising a gas mixture including Kr and F atoms. Alternatively, though, the laser gas mixture (gain medium) filling the laser oscillator 110 may instead contain Ar and F atoms, in which case the laser beam L is an ArF excimer laser beam having a wavelength of about 193 nm. Thus, various changes in the form and details of the preferred embodiments are seen to be within the true spirit and scope of the present invention as set forth in the following claims.

What is claimed is:

1. A line narrowing module comprising:
an elliptical mirror having first and second foci and having an opening adjacent to the second focus;
a diffraction grating disposed at the first focus, whereby the diffraction grating separates a laser beam incident thereon into different lines; and
a laser beam dispersion and extraction unit situated in the module and composed to disperse a laser beam, incident thereon from a region containing the second focus of the elliptical mirror, over the diffraction grating and selectively extract from the lines a laser beam having a desired bandwidth narrower than that which is incident on the diffraction grating,
wherein most of the light constituted by the lines of the laser beam other than the band of the laser beam extracted by the laser beam dispersion and extraction unit and emanating from the diffraction grating is reflected by the elliptical mirror to the region having the second focus.

2. The line narrowing module according to claim 1, wherein the elliptical mirror has an output window therein at a location situated relative to the laser beam dispersion and extraction unit such that laser beam extracted by the laser beam dispersion and extraction unit is incident on the output window.

3. The line narrowing module according to claim 2, wherein the laser beam dispersion and extraction unit comprises a prism, and a selective reflective coating covering one side of the prism, the selective reflective coating having a composition by which only the laser beam having the desired bandwidth is reflected thereby, and the prism being oriented to expand a laser beam incident thereon from a region containing the second focus of the elliptical mirror, direct the expanded laser beam onto the diffraction grating, and position the selective reflective coating relative to the output window such that the laser beam having the desired bandwidth is reflected by the coating onto the output window.

4. The line narrowing module according to claim 2, wherein the output window comprises a transparent body, and a selective transmission layer coating covering a surface of the transparent body, the selective transmission coating having a composition by which the laser beam having the desired bandwidth is transmitted therethrough and the other lines of the laser beam are reflected thereby.

5. The line narrowing module according to claim 2, wherein the elliptical mirror comprises an elliptical body and a reflective layer covering an inner surface of the elliptical body.

6. The line narrowing module according to claim 1, wherein the diffraction grating is structured to separate a KrF excimer laser beam into different lines, and the laser beam dispersion and extraction unit is composed to selectively extract from the KrF excimer laser beam a KrF laser beam having a bandwidth of about 0.6 pm.

7. The line narrowing module according to claim 1, further comprising a heat sink disposed along an outer surface of the elliptical mirror, whereby heat is conducted from the elliptical mirror to the exterior thereof.

8. The line narrowing module according to claim 1, further comprising a chamber in which the elliptical mirror is disposed to scatter light that is not reflected by the elliptical mirror to the region having the second focus.

9. The line narrowing module according to claim 1, further comprising a cooling unit that cools the diffraction grating.

10. The line narrowing module according to claim 9, wherein the cooling unit includes a supply of cooling gas, and a nozzle connected to the supply of cooling gas and oriented to supply gas onto a rear surface of the diffraction grating opposite a front surface onto which a laser beam is directed by the laser beam dispersion and extraction unit.

11. The line narrowing module according to claim 10, further comprising a cooling gas anti-diffusion shield disposed around the diffraction grating between the front and rear surfaces thereof to prevent the cooling gas from diffusing toward the front surface of the diffraction grating.

12. A light source of an exposure apparatus comprising:
a laser oscillator in which a laser beam is generated, and having a front window through which one fraction of the laser beam is extracted along an optical path and a rear window through which another fraction of the laser beam is extracted;
an elliptical mirror having first and second foci and an opening adjacent to the second focus and through which opening and second focus the optical path extends such that a fraction of the laser beam generated in the laser oscillator passes into the elliptical mirror;
a diffraction grating disposed at the first focus, whereby the diffraction grating separates a laser beam incident thereon into different lines;

a laser beam dispersion and extraction unit situated along the optical path between the front window of the laser oscillator and the diffraction grating and composed to disperse the laser beam extracted through the front window of the laser oscillator across the diffraction grating, selectively extract from the lines a laser beam having a desired bandwidth narrower than that generated by the laser oscillator, and direct the extracted laser beam having the desired bandwidth along a second optical path that does not pass into the laser oscillator, wherein the laser beam having the desired bandwidth is output by the light source as exposure light, and most of the light constituted by the lines of the laser beam other than the band of the laser beam extracted by the laser beam dispersion and extraction unit and emanating from the diffraction grating is reflected by the elliptical mirror to the region having the second focus; and a laser beam return unit that receives the fraction of the laser beam extracted through the rear window of the laser oscillator and returns the same to the laser oscillator.

13. The light source of an exposure apparatus according to claim 12, wherein the elliptical mirror has an output window therein at a location situated relative to the laser beam dispersion and extraction unit such that laser beam extracted by the laser beam dispersion and extraction unit is incident on the output window.

14. The light source of an exposure apparatus according to claim 13, wherein the laser beam dispersion and extraction unit comprises a prism, and a selective reflective coating covering one side of the prism, the selective reflective coating having a composition by which only the laser beam having the desired bandwidth is reflected thereby, and the prism being oriented to expand a laser beam incident thereon from a region containing the second focus of the elliptical mirror, direct the expanded laser beam onto the diffraction grating, and position the selective reflective coating relative to the output window such that the diffracted laser beam having the desired bandwidth is reflected by the coating onto the output window.

15. The light source of an exposure apparatus according to claim 13, wherein the output window comprises a transparent body, and a selective transmission layer coating covering a surface of the transparent body, the selective transmission coating having a composition by which only the diffracted laser beam having the desired bandwidth is transmitted therethrough and the other lines of the laser beam are reflected thereby.

16. The light source of an exposure apparatus according to claim 12, wherein the elliptical mirror comprises an elliptical body and a reflective layer covering an inner surface of the elliptical body.

17. The light source of an exposure apparatus according to claim 12, wherein the front window of the laser oscillator is located at the second focus of the elliptical mirror.

18. The light source of an exposure apparatus according to claim 12, further comprising a heat sink disposed along an outer surface of the elliptical mirror, whereby heat is conducted from the elliptical mirror to the exterior thereof.

19. The light source of an exposure apparatus according to claim 12, further comprising a chamber in which the elliptical mirror is disposed to scatter light that is not reflected by the elliptical mirror to the region having the second focus.

20. The light source of an exposure apparatus according to claim 12, further comprising an optical detector that detects the laser beam output by the light source and generating signals representative thereof, and an optical analysis unit operatively connected to the optical detector so as to receive the signals therefrom and configured to determine optical characteristics of the laser beam, output by the light source as exposure light, on the basis of values of the signals generated by the optical detector.

21. The light source of an exposure apparatus according to claim 12, wherein the laser oscillator generates a KrF excimer laser beam, the diffraction grating is structured to separate the KrF excimer laser beam into different lines, and the laser beam dispersion and extraction unit is composed to selectively extract from the KrF excimer laser beam a KrF laser beam having a bandwidth of about 0.6 pm.

22. The light source of an exposure apparatus according to claim 12, further comprising a cooling unit that cools the diffraction grating.

23. The light source of an exposure apparatus according to claim 22, wherein the cooling unit includes a supply of cooling gas, and a nozzle connected to the supply of cooling gas and oriented to supply gas onto a rear surface of the diffraction grating opposite a front surface onto which a laser beam is directed by the laser beam dispersion and extraction unit.

24. The light source of an exposure apparatus according to claim 23, further comprising a cooling gas anti-diffusion shield disposed around the diffraction grating between the front and rear surfaces thereof to prevent the cooling gas from diffusing toward the front surface of the diffraction grating.

25. A light source of an exposure apparatus, the light source having a first optical axis, and a second optical axis along which light is output by the light source, and the light source comprising:

a laser oscillator that generates a laser beam, the laser oscillator having a front window through which one fraction of the laser beam is extracted along the first optical axis of the light source, and a rear window through which another fraction of the laser beam is extracted;

a line narrowing module disposed along the first optical axis so as to receive the laser beam extracted through the front window of the laser oscillator and operative to selectively extract from the laser beam generated by the laser oscillator a laser beam having a desired bandwidth whereby the desired bandwidth is narrower than that of the laser beam generated by the laser oscillator, directly output the laser beam having the desired bandwidth along the second axis of the light source, and return to the laser oscillator most of the light constituted by lines of the laser beam other than that of the band of the selectively extracted laser beam, and wherein the second optical axis of the light source extends from the line narrowing module and does not extend into the laser oscillator such that the laser beam having the desired bandwidth and output by the line narrowing module never passes back into the laser oscillator before being output by the light source; and a laser beam return unit that receives the fraction of the laser beam extracted through the rear window of the laser oscillator and returns the same to the laser oscillator.

26. A method of producing exposure light for use in a process of exposing a resist, the method comprising:

generating a laser beam in a laser oscillator;

extracting one fraction of the laser beam from the laser oscillator through a front window of the laser oscillator;

line-narrowing the one fraction of the laser beam to thereby produce a laser beam having a desired bandwidth that is narrower than that of the laser beam generated in the laser oscillator and light constituted by lines of the one fraction of the laser beam other than that of the laser beam having the desired bandwidth;

returning most of said light to the laser oscillator;

once the laser beam having the desired bandwidth is produced, outputting the laser beam having the desired bandwidth as the exposure light without ever returning it to the laser oscillator;

extracting another fraction of the laser beam from the laser oscillator through a rear window of the laser oscillator and returning substantially all of said another fraction of the laser beam to the laser oscillator.

27. The method according to claim 26, wherein the line narrowing comprises dispersing said one fraction of the laser beam across a diffraction grating to separate said one fraction of the laser beam into different lines.

28. The method according to claim 27, and further comprising cooling the diffraction grating.

29. The method according to claim 28, wherein the cooling of the diffraction grating comprises spraying a gas onto a rear surface of the diffraction grating opposite a front surface over which said one fraction of the laser beam is dispersed.

30. The method according to claim 29, wherein the cooling gas is nitrogen or helium.

31. The method according to claim 29, and further comprising shielding the front surface of the diffraction grating from the gas.

32. The method according to claim 26, wherein the returning of most of said light, constituted by lines other than that of the laser beam having the desired bandwidth, to the laser oscillator comprises reflecting said light back into the laser oscillator using an optical component comprising a reflective surface.

33. The method according to claim 32, wherein the outputting of the laser beam having the desired bandwidth as the exposure light comprises directing the laser beam having the desired line width through a window in the reflective surface.

* * * * *